United States Patent
Willems van Dijk et al.

(10) Patent No.: US 7,397,940 B2
(45) Date of Patent: Jul. 8, 2008

(54) OBJECT POSITIONING METHOD FOR A LITHOGRAPHIC PROJECTION APPARATUS

(75) Inventors: Marcus J. H. Willems van Dijk, Uden (NL); Engelbertus A. F. van de Pasch, Oirschot (NL); Thomas J. M. Castenmiller, Eindhoven (NL); Andreas B. G. Ariens, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 562 days.

(21) Appl. No.: 09/777,460

(22) Filed: Feb. 8, 2001

(65) Prior Publication Data
US 2001/0014170 A1 Aug. 16, 2001

(30) Foreign Application Priority Data
Feb. 10, 2000 (EP) .................................. 00200431

(51) Int. Cl.
*G06K 9/00* (2006.01)
(52) U.S. Cl. .................... 382/144; 382/143; 382/145
(58) Field of Classification Search ............... 382/141, 382/143–151, 287; 348/86, 97, 94, 95, 126; 700/95; 29/833; 356/401, 237.1, 399, 237.4, 356/237.5; 355/67; 310/12
See application file for complete search history.

(56) References Cited

U.S. PATENT DOCUMENTS

| | | | | |
|---|---|---|---|---|
| 4,297,676 A | * | 10/1981 | Moriya et al. | ................ 382/287 |
| 4,778,275 A | * | 10/1988 | van den Brink et al. | ..... 356/401 |
| 5,296,891 A | * | 3/1994 | Vogt et al. | ..................... 355/67 |
| 5,717,482 A | | 2/1998 | Akutsu et al. | |
| 5,969,441 A | * | 10/1999 | Loopstra et al. | ................ 310/12 |
| 6,420,716 B1 | * | 7/2002 | Cox et al. | ................ 250/492.2 |

FOREIGN PATENT DOCUMENTS

| | | |
|---|---|---|
| EP | 652 487 | 5/1995 |
| JP | 5-166701 | 7/1993 |
| JP | 6-302495 | 10/1994 |
| JP | 10-70177 | 3/1998 |

OTHER PUBLICATIONS

European Office Action issued on EP Application No. 01 301 117.6-2222 dated Nov. 17, 2005.
English translation of Japanese Office Action issued in Japanese Patent Application No. 2001-075037 mailed Jan. 24, 2007.

* cited by examiner

*Primary Examiner*—Vikkram Bali
(74) *Attorney, Agent, or Firm*—Pillsbury Winthrop Shaw Pittman LLP

(57) ABSTRACT

A method for placement of a object such as a substrate or a mask on a table, said method including:
- a first placement step in which the object is placed on a first position on the table;
- a measuring step in which a displacement between the first position of the object and the required position of the object is determined;
- a removing step in which the object is released and removed from the table;
- a moving step in which the object and the table are moved relatively to each other by substantially the said displacement, in a direction substantially parallel to the surface of the table; and
- a second placement step in which the object is placed at the required position on the table.

14 Claims, 5 Drawing Sheets

OBJECT POSITIONING METHOD FOR A LITHOGRAPHIC PROJECTION APPARATUS

The present application claims priority to European Patent Application No. 00200431.5, filed Feb. 10, 2000, which is incorporated herein by reference in its entirety.

BACKGROUND OF THE INVENTION

1. Field of the Invention

The invention relates to a positioning method and a device, in particularly for a lithographic projection apparatus. More particular, the invention relates to a method of positioning an object such as a mask or a substrate to a required position on an object table in a lithographic projection apparatus comprising:

- a radiation system for supplying a projection beam of radiation;
- a first object table for holding patterning means capable of patterning the projection beam according to a desired pattern;
- a second object table for holding a substrate; and
- a projection system for projecting the patterned beam onto a target portion of the substrate.

2. Background of the Related Art

The term "patterning means" or "mask" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such patterning means include:

A mask held by said first object table. The concept of a mask is well known in lithography, and its includes mask types such as binary, alternating phase-shift, and attenuated phase-shift, as well as various hybrid mask types. Placement of such a mask in the projection beam causes selective transmission (in the case of a transmissive mask) or reflection (in the case of a reflective mask) of the radiation impinging on the mask, according to a pattern on the mask. The first object table ensures that the mask can be held at a desired position in the incoming projection beam, and that it can be moved relative to the beam if so desired.

A programmable mirror array held by a structure, which is referred to as first object table. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

A programmable LCD array held by a structure, which is referred to as first object table. An example of such a construction is given in U.S. Pat. No. 5,229,872, which is incorporated herein by reference.

For purposes of simplicity, the rest of this text may, at certain locations, specifically direct itself to examples involving a mask; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once, such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus according to the invention, a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The projection system encompassing various types of projection system, including refractive optics, and/or reflective optics may hereinafter be referred to as the "lens"; however, this term should be broadly interpreted as, and including catadioptric systems, for example. The radiation system may also include elements operating according to any of these principles for directing, shaping or controlling the projection beam, and such elements may also be referred to below, collectively or singularly, as a "lens". In addition, the first and second object tables may be referred to as the "mask table" and the "substrate table", respectively.

In general, apparatus of this type contained a single first object (mask) table and a single second object (substrate) table. However, machines are becoming available in which there are at least two independently movable substrate tables; see, for example, the multi-stage apparatus described in U.S. Pat. No. 5,969,441 and WO 98/40791, incorporated herein by reference. The basic operating principle behind such a multi-stage apparatus is that, while a first substrate table is underneath the projection system so as to allow exposure of a first substrate located on that table, a second substrate table can run to a loading position, discharge an exposed substrate, pick up a new substrate, perform some initial metrology steps on the new substrate, and then stand by to transfer this new substrate to an exposure position underneath the projection system as soon as exposure of the first substrate is completed, whence the cycle repeats itself; in this manner, it is possible to achieve a substantially increased machine throughout, which in turn improves the cost of ownership of the machine.

In a manufacturing process using a lithographic projection apparatus, a pattern in a mask is imaged onto a substrate which is at least partially covered by a layer of radiation sensitive material (resist). For this process it is necessary to position the substrate and the mask on respective object tables with a high accuracy, both with regard to each other and with regard to the tables.

If an object, such as a substrate 1 (see FIG. 2) is not positioned in a correct rotational position on an object table, such as a substrate table, 5 a position measurement error can occur during subsequent alignment of the substrate 1 to the mask. During alignment the substrate 1 is brought into the same rotational orientation as the mask, to which end it can be necessary to rotate the substrate table 5. An interferometer 9 used in a sensor system 7 can be sensitive to this rotation and give an error in the distance which is measured by using a laser beam 11 laterally directed to a side mirror on the table 5. Said error is a so-called beam-point error, which generally increases with increasing rotation of the table 5. The measurement error thus caused can give an error in the super-positioning of two concurrent images exposed on successive layers on the substrate 1. This error in the super-positioning of two concurrent images is generally called an overlay error.

Beam-point errors are caused by inconsistency in the orthogonality of mirror surfaces to interferometer beams. FIG. 3a shows an interferometer I that measures a distance L between the interferometer I and a mirror T, using a light beam pointed at the mirror T. As here depicted, the mirror T is rotated with dS with respect to the nominal incident beam, so that the angle between the beam of incidence and the beam of reflection is 2 dS. The total length of the interferometer beam is then B=L+L/(cos 2 dS). The distance L can accordingly be calculated from the total length B measured by the interferometer I and from the known rotation dS. Optimally, the interferometer beam is directed so as to be parallel to the X-direction in a given reference co-ordinate system. However, factors such as thermal instability and mechanical play can cause a transient deviation from this parallelism, which is referred to as the beam-point error. FIG. 3b shows a beam-point error dE at a rotation dS=0. The total length of the beam is B=L/(cos dE)+L/(cos dE). This formula shows that for small beam point errors dE the influence on the total beam lengths is small, however, if the mirror T is rotated with dS the influence of the beam-point error increases. FIG. 3c combines the error dE of FIG. 3b and the rotation dS of FIG. 3a. The total length of the beam is B=L/(cos dE)+L/cos (dE+2 dS). Differentiating this function and applying a small-angle approximation for dE and dS (dE typically being of the order of about 5 to 100 μrad), one obtains the expression dB/dE≈L*dS*dE. From this it is evident that, for relatively high values of dS, the sensitivity of B to beam-point errors dE increases.

The problem is further deteriorated in that an error in the rotational position of the mirror T (e.g. when mounted on the side of the substrate table 5 in FIG. 2) also has an influence on the measured distance. The influence of this error is twice as big as the beampoint error because, as shown in FIG. 3a, a mirror rotation has a double influence on the direction of the reflected beam. An error $dE_m$ in the mirror rotation has an influence on the measured total length B of the beam according to the expression $dB/dE_m \approx 2*L*dS*dE_m$. It is evident that, for relatively high values of dS, the sensitivity to errors $dE_m$ in the rotational position of the mirror T increases.

Both errors are shown as one-dimensional errors; however in reality these errors are two-dimensional, such that the error can be in the plane of FIG. 3a to 3c (as shown) and also in a direction perpendicular to said plane. Similar considerations apply to the case whereby the object 1 in FIG. 2 is a mask, and the object table 5 is a mask table.

Apart from the exposure problems caused by beam-point errors, further problems can arise if the object is wrongly positioned upon the respective object table. FIG. 4a shows a substrate 1 that is correctly positioned upon a vacuum generating surface 13. The substrate 1 covers the vacuum generating surface 13 in total, with only a small overlap between the border 15 of the vacuum generating surface 13 and the edge 2 of the substrate 1. Vacuum from the vacuum source 17 is applied to the vacuum generating surface 13 via the vacuum distribution means 19 and the vacuum chamber 21 to generate a vacuum force F on the substrate 1.

FIG. 4b shows a substrate 1 which is incorrectly placed upon a vacuum generating surface 13. The substrate 1 covers the vacuum generating surface 13 in total, but on one side too much overlap occurs between the edge 2 of the substrate 1 and the border 15 of the vacuum generating surface 13. On said one side, less vacuum force F can be applied to the edge 2; consequently, the substrate 1 can deform especially at the edge 2. The exposures on the substrate can fail because of image deformation on the non-planar edge.

FIG. 4c also shows a substrate 1 that is also incorrectly placed upon the vacuum-generating surface 13. The substrate 1 does not cover the vacuum generating surface 13 in total so that air A will enter the vacuum chamber 21 and the vacuum force F will be less than optimal. During exposure, the badly adhered substrate 1 can move over the vacuum generating surface 13, causing bad exposures to occur. If the substrate 1 gets totally loose, the substrate 1 can fall off the vacuum generating surface 13 and damage the surrounding apparatus. Same considerations apply to the case where the substrate 1 is held upon the object table 5 with electrostatic force. The latter may necessary when the invention is applied to an apparatus that is employed in vacuum.

SUMMARY OF THE INVENTION

It is an object of the invention to alleviate, at least partially, the above problems. Accordingly the present invention provides a method of positioning an object at a required position on an object table in a lithographic projection apparatus according to the opening paragraph, characterised in that said method comprises the following steps:

a first placement step in which the object is placed at a first position on the table;

a measuring step in which a displacement between the first position of the object and the required position of the object is determined;

a removing step in which the object is released and removed from the table;

a moving step in which the object and the table are moved relatively to each other by substantially the said displacement, in a direction substantially parallel to the plane of the table; and a second placement step in which the object is placed at substantially the required position on the table.

The method of the invention enables the positioning of an object, such as a substrate or a mask, with a high accuracy on an object table, such as a substrate table or a mask table, such that when the mask and the substrate are brought into the same rotational orientation during alignment, the required rotation of the table with respect to the employed interferometer system is limited. The increased orthogonality of the object table mirror surfaces to the interferometer beams reduces the sensitivity to beam-point errors and errors in the rotational position of the object table mirror surfaces. Another advantage of the invention is that the object is better positioned upon the vacuum generating surface. Deformation of the object will be avoided and the exposure of images will be improved. Also the risks of the object not totally covering the vacuum generating surface is reduced by a better positioning of the object on the table.

The measuring step can be accomplished by aligning a first mark, with a known position with respect to the object, to a second mark. Alignment can be done such that the second mark is located upon the object table (e.g. in the form of a fiducial) upon which the object is placed and has a known position relative to the required position of the object. Another possibility is that the object is located on one object table and that the second mark is located upon the other object table. Alignment can also be done such that the first mark is on the substrate and the second mark is on the mask, or the other way around. Advantageously a plurality of first marks upon the object can be aligned to a plurality of second marks. The measuring step also can be accomplished using imaging means to obtain information about the first position of the object on the table. Said imaging means can be a camera system or a CCD array, able to measure the first position of the object on the table with the required precision. The information thus obtained about the first position of the object on the table, together with information regarding the required position of the object on the table, can be processed in calculating means so as to calculate the said displacement. Said required position of the object on the table can be determined beforehand and stored in a memory device, wherefrom it can be retrieved when necessary. The said displacement can be linear in the plane of the vacuum generating surface of the table and/or can be angular around an axis perpendicular to said surface. The object can be placed on the object table with the aid of vacuum clamping means on a handler arm, for example.

To increase the accuracy it may be necessary to repeat the method until the object is on the required position on the table.

The invention also relates to a method of positioning a substrate at a required position on a substrate table, characterised in that said method comprises the following steps:

a first placement step in which the substrate is placed at a first position on the table;

a measuring step in which a displacement between the first position of the substrate and the required position of the substrate is determined;

a removing step in which the substrate is released and removed from the table;

a moving step in which the substrate and the table are moved relatively to each other by substantially the said displacement, in a direction substantially parallel to the plane of the table; and a second placement step in which the substrate is placed at substantially the required position on the table.

The invention also relates to a device manufacturing method comprising the steps of:

(a) providing a second object table with a substrate which is at least partially covered by a layer of radiation-sensitive material;

(b) using patterning means to endow the projection beam with a pattern in its cross-section; and (c) projecting the patterned beam onto a target portion of the layer of radiation-sensitive material, characterised in that, prior to step (c), the following actions are performed:

a first placement step in which the substrate is placed at a first position on the second object table;

a measuring step in which a displacement between the first position of the substrate and the required position of the substrate is determined;

a removing step in which the substrate is released and removed from the second object table;

a moving step in which the substrate and the second object table are moved relatively to each other by substantially the said displacement, in a direction substantially parallel to the plane of the second object table and a second placement step in which the substrate is placed at substantially the required position on the second object table.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The invention and its advantages will be further elucidated with the aid of exemplary embodiments and the accompanying schematic drawings, whereby.

DETAILED DESCRIPTION OF THE INVENTION

Embodiment 1

Figure 1:
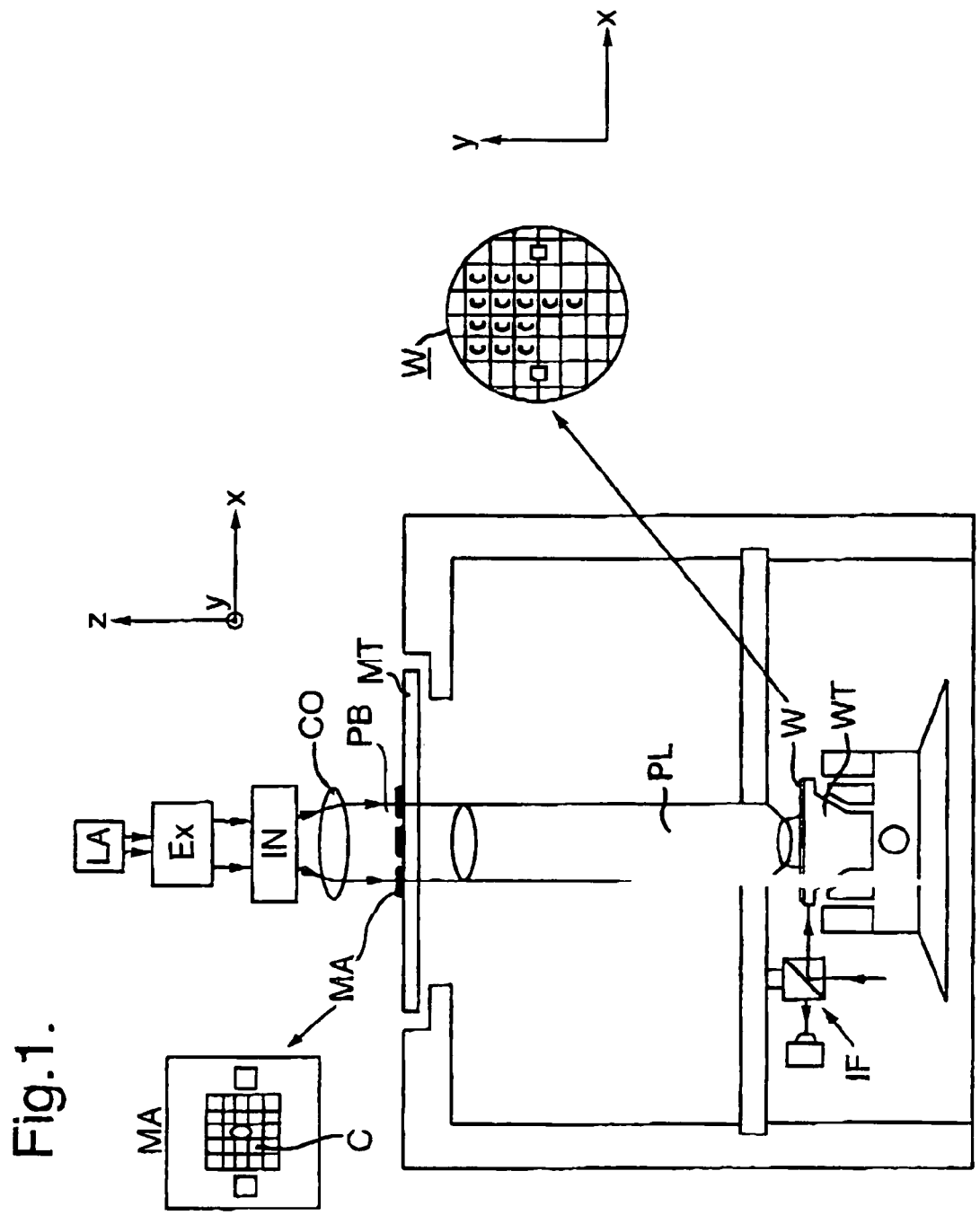
FIG. 1 schematically depicts a lithographic projection apparatus according to the invention.
Figure 2:
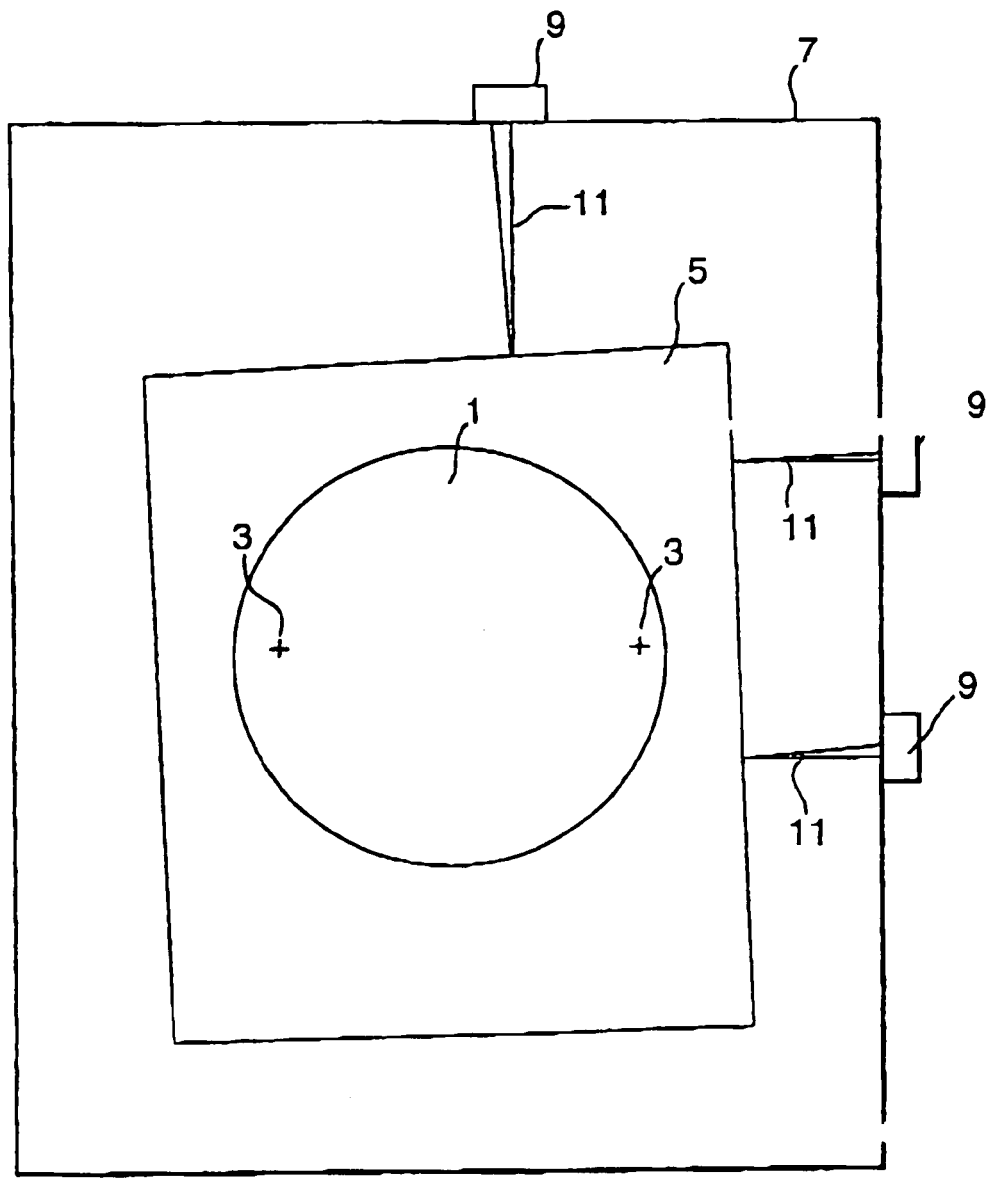
FIG. 2 explains the effect of a rotational error in the positioning of an object on an object table, on the rotational orientation of the object table.
Figure 3A:
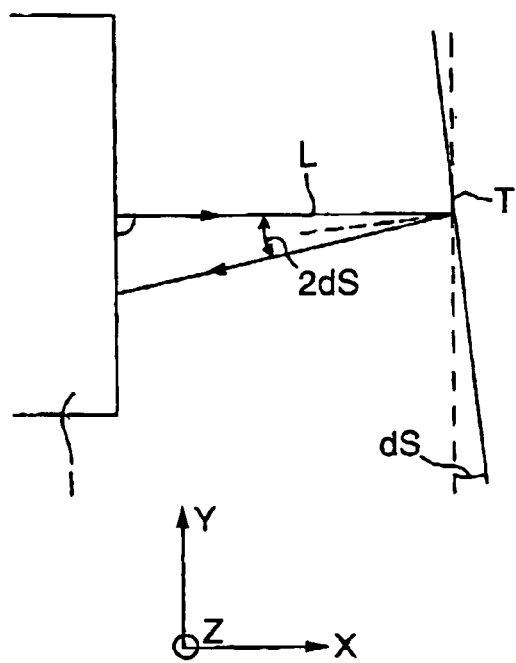
FIGS. 3a to 3c explain the occurrence of beam point errors caused by rotating a table relative to an interferometer beam.
Figure 3B:
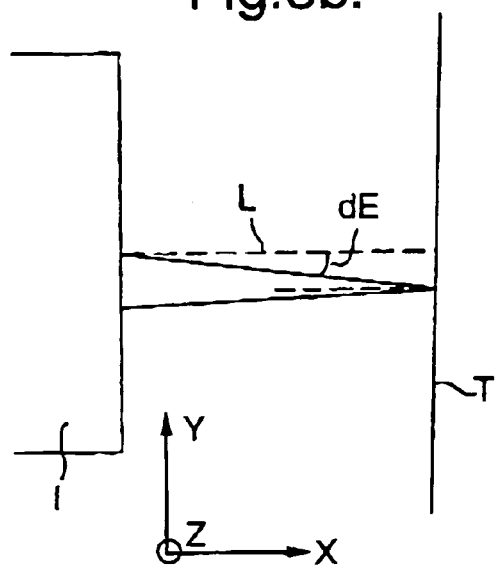
Figure 3C:
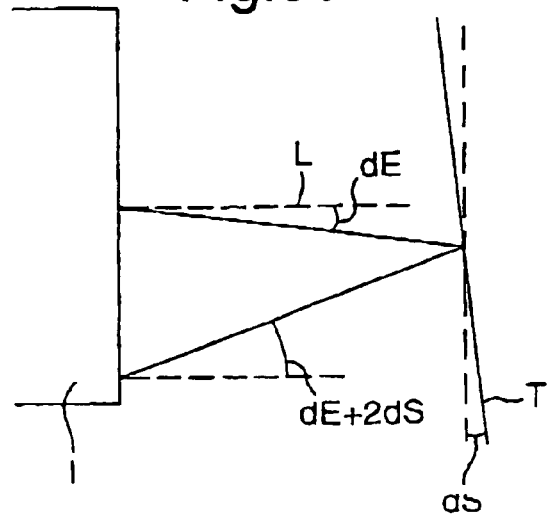
Figure 4A:
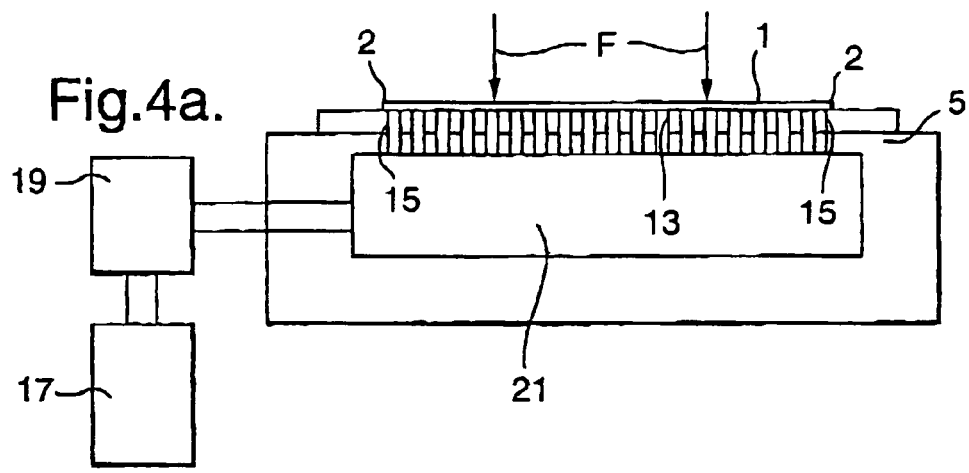
FIG. 4a to 4c schematically depicts differently positioned objects on object tables.
Figure 4B:
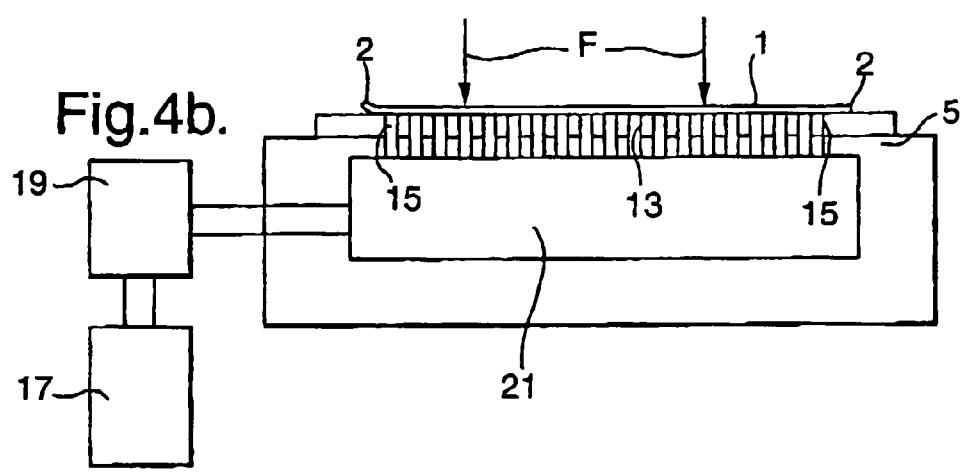
Figure 4C:
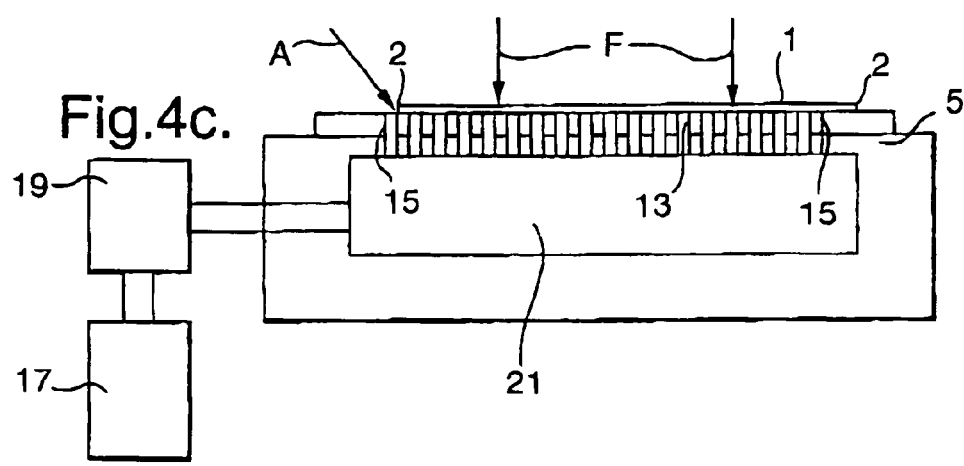

FIG. 1 schematically depicts a lithographic projection apparatus according to the invention. The apparatus comprises:

- a radiation system Ex, IN, CO for supplying a projection beam PB of radiation, such as ultraviolet light (e.g. at a wavelength of 365 nm, 248 nm, 193 nm or 157 nm), EUV, X-rays, electrons or ions;
- a first object table (mask table) MT provided with a mask holder for holding a mask MA (e.g. a reticle);
- a second object table (substrate table) WT provided with a substrate holder for holding a substrate W (e.g. a resist-coated silicon wafer);
- a projection system PL (e.g. a lens or catadioptric system, a mirror group or an array of field deflectors) for imaging an irradiated portion of the mask MA onto a target portion C (die) of the substrate W. As here depicted, the apparatus comprises refractive components. However, it may alternatively comprise one or more reflective components.

Alternatively, the apparatus may employ another kind of patterning means, such as a programmable mirror array of a type described above.

The source LA (e.g. a Hg lamp, an excimer laser, a thermionic gun, an ion source, an electron beam source or a wiggler/undulator situated around the path of an electron beam in a storage ring or synchrotron) produces a beam of radiation. This beam is fed into an illumination system (illuminator), either directly or after having traversed conditioning means, such as a beam expander Ex, for example. The illuminator may comprise adjusting means for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA which is held in the mask holder on the mask table MT. Having passed through the mask MA, the beam PB passes through the projection system PL, which focuses the beam PB onto a target area C of the substrate W. With the aid of the interferometric displacement measuring means IF, the substrate table WT can be moved accurately, e.g. so as to position different target areas C in the path of the beam PB. Similarly, the mask table MT can be positioned very accurately with respect to the beam PB. In general, movement of the object tables MT, WT will be realised with the aid of a long stroke module (course positioning) and a short stroke module (fine positioning), which are not explicitly depicted in FIG. 1. The depicted apparatus can be used in two different modes:

In step mode, the mask table MT is kept essentially stationary, and an entire mask image is projected in one go (i.e. a single "flash") onto a target portion C. The substrate table WT is then shifted in the X and/or Y directions so that a different target portion C can be irradiated by the (stationary) beam PB;

In scan mode, essentially the same scenario applies, except that a given target portion C is not exposed in a single "flash". Instead, the mask table MT is movable in a given direction (the so-called "scan direction", e.g. the X direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 5:
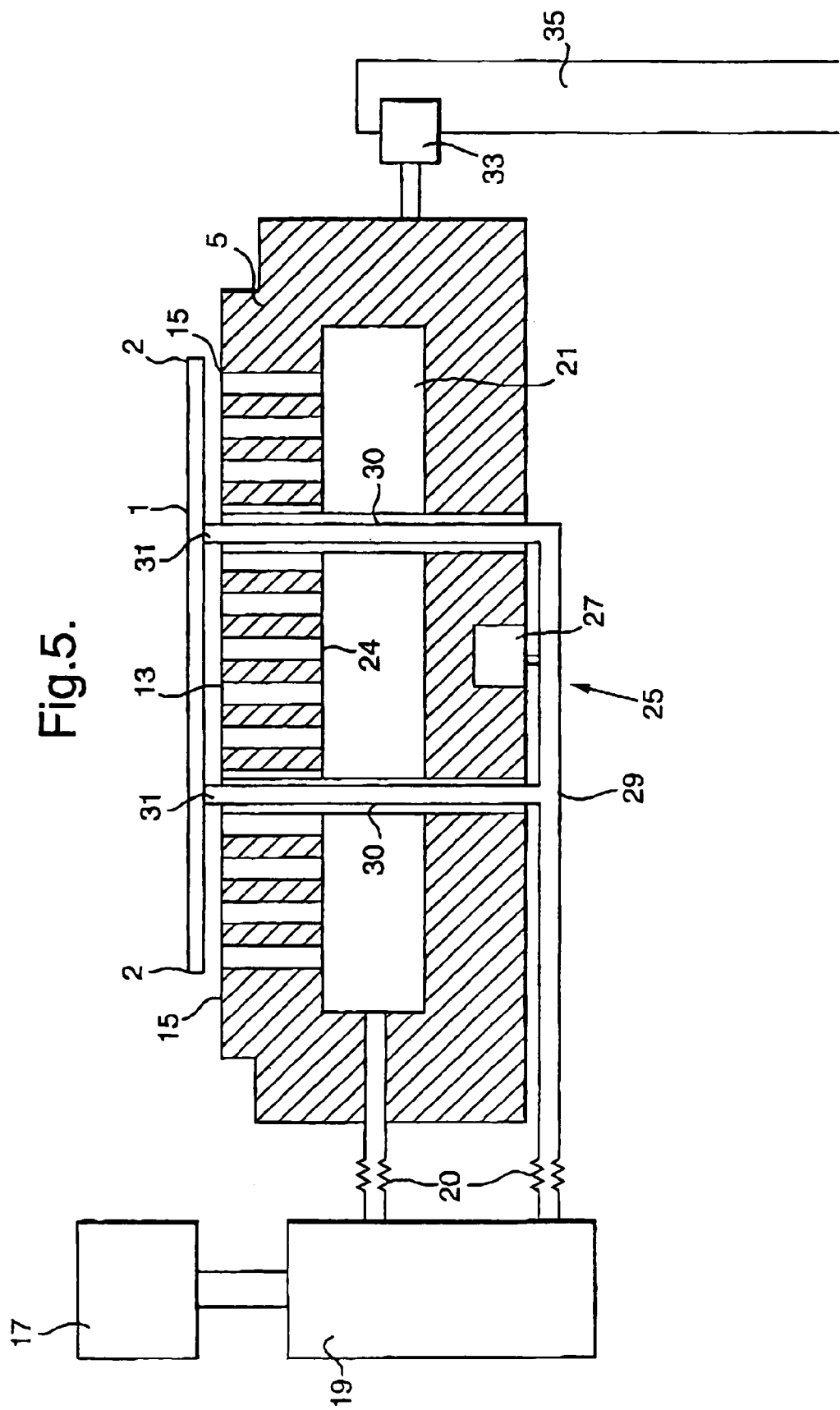
FIG. 5 shows a preferred embodiment of an object table according to the invention.

FIG. 5 shows a preferred embodiment of an object table according to the invention. From the figure the following items can be seen;

- a substrate (wafer) 1 having an edge 2;
- a substrate table 5 comprising a vacuum chamber 21 connected via vacuum apertures 24 to a vacuum generating surface 13 having a border 15;
- a handler 25 comprising an actuator 27, hollow tubes 29 and vacuum clamping means 31 for placing, holding and picking up the substrate 1, said handler 25 being movable through table apertures 30;
- a vacuum source 17 and vacuum distribution means 19 for applying a vacuum to the handler 25 or the vacuum chamber 21 via flexible vacuum tubes 20; and
- a table actuator 33 connected to a base frame 35, for moving the table 5.

In a first placement step, the substrate 1 will be placed on the vacuum clamping means 31 of the handler 25 by substrate transporting means (more information with regard to substrate transporting means can be gleaned from European Patent Application EP 1052546). A vacuum is applied to the vacuum clamping means 31 by opening a valve within the vacuum distribution means 19, which connect the vacuum source 17 to the vacuum clamping means 31 via the hollow tubes 29 and the flexible vacuum tube 20. The vacuum sucks the substrate 1 to the vacuum clamping means 31, whence the substrate transporting means are released and retracted from the substrate 1. The actuator 27 lowers the handler 25 and the substrate 1 to the vacuum generating surface 13 and a vacuum is applied to said surface via the vacuum apertures 24 and the vacuum chamber 21 by opening a valve within the vacuum distribution means 19. This vacuum will apply a vacuum force to the substrate 1, which fixes the substrate to the vacuum generating surface 13 on the substrate table 5. The vacuum on the vacuum clamping means 31 is released (the pressure is raised to the pressure of the environment of the table) within the vacuum distribution means 19 and the handler 25 is further lowered by the actuator 27. The handler 25 can be moved totally out of the table 5 or the handler 25 can be moved a little down and stay inside the table 5.

After this first placement step a measurement step will follow. In that step the position of the substrate 1 on the table 5 will be measured, and a displacement between this first position of the substrate and a required position of the substrate 1 on the table 5 will be determined. This can be done with an off-axis alignment unit (more information with regard to off-axis alignment can be gleaned from International Patent Application WO 98/39689, for example) which measures the position of one or more marks on the substrate 1 relative to one or more reference marks on the table 5. This will provide very precise information about the first position of the substrate 1 on the table 5; whence a calculation unit (not shown) can calculate a displacement between said first position of the substrate 1 and the required position of the substrate 1. The required position of the substrate on the table can be calibrated beforehand and stored in a memory device. In this required position the interferometer beams will be pointing orthogonal to a mirror (not shown) mounted on the side of the substrate table 5, and the substrate 1 will be positioned correctly upon a vacuum generating surface of the substrate table 5. Another possibility is that one or more marks on the substrate 1 be aligned to one or more marks on a mask. During this procedure, also called on-axis alignment, (see for more information with regard to on-axis alignment U.S. Pat. No. 4,778,275, for example) it may be necessary to rotate a table holding the mask and/or to rotate the substrate table 5 to bring the mask and the substrate into the same rotational orientation. Interferometers measure this rotation very accurately and provide the calculation unit with information about the position of the substrate with regard to the mask, whence a displacement between the first position and the required position can be determined. With an on-axis alignment procedure it is also possible to align the marks on the substrate to marks on the mask table and to align marks on the mask to marks located upon the substrate table. Alternatively, imaging means such as a camera can be used to deliver information of the first position of the substrate on the table to the calculation unit.

After this measurement step a removing step can be applied to release and remove the substrate 1 from the substrate table 5. The handler 25, which will be lifted by the actuator 27 such that the vacuum clamping means 31 touch the substrate 1, will accomplish this. After this, a vacuum from the vacuum source 17 will be applied to the vacuum clamping means 31 via the flexible vacuum tube 20 and the hollow tubes 29 by opening a valve within the vacuum distribution means 19. Then the vacuum on the vacuum generating surface 13 will be released by releasing the vacuum within the vacuum distribution means 19, and the actuator 27 will lift the handler 25 and the substrate 1.

After this removing step the table 5 will be moved by the calculated displacement while the substrate 1 supported by the handler 25 stays at the same position. It is also possible that the table 5 be kept still and that the handler 25 be moved by the calculated displacement. Alternatively, both the table 5 and the handler 25 will be moved to achieve the same calculated displacement relative to each other. In general, a pre-alignment unit will be used to ensure a good coarse placement of the substrate 1 on the table 5; in that way, one avoids the need to use a large displacement in the moving step and the table apertures 30 in which the handler will move through the table can therefore be kept rather small. See for more information with regard to a pre-alignment unit U.S. Pat. No. 5,026,166, for example.

After this moving step a second placement step will be used to place the substrate 1 on the table 5 again. This is done in the same manner as for the first placement step. The substrate 1, sucked to the vacuum generating surface 13 on the table 5, is now in the required position.

By a "vacuum" a reduced gas pressure is of course meant, such as $5.5*10^4$ Pa for example, such that the excess external pressure provides a normal force holding the substrate 1 and the vacuum generating surface 13 or the vacuum clamping means 31 against each other. Relative motion between the substrate and the table in the plane of the vacuum generating surface is impeded by the friction between the two components, which is increased by the normal force. The coefficient of friction between the substrate and the vacuum generating surface can, of course, be selected by the choice of material for the contact surfaces.

The above described and illustrated features of embodiments of the invention can be used separately or in any combination. The figures are merely schematic and are not to scale, and the relative dimensions of elements in each figure are not necessarily to scale with each other.

While specific embodiments have been described above, it will be appreciated that the invention may be practiced otherwise than as described. For example, if the object is a mask and the invention is used to position the mask on a mask table, the method can be exactly the same, except that the handler for said mask will preferably support the mask at it sides to avoid any damage to the mask.

The invention claimed is:

1. A method of positioning an object at a required position on a first object table in a lithographic projection apparatus, comprising:
   placing an object at a first position on the first object table;
   measuring a displacement between the first position of the object and a required position of the object on the first object table;
   removing the object from the first object table;
   translating the removed object, the first object table, or both, relative to each other by substantially the measured displacement, in a direction substantially parallel to the plane of the first object table; and
   placing the object at substantially the required position on the first object table,
   wherein a first surface of the object contacts the first object table, and wherein the required position corresponds to a position of the object at which a clamping force that clamps the object on the first object table is substantially homogenous on the first surface of the object.

2. A method according to claim 1, wherein said measuring comprises aligning a first mark on the object to a second mark.

3. A method according to claim 2, wherein said second mark is located on the one of the first object table and a second object table.

4. A method according to claim 1, wherein a mask is held by the first object table.

5. A method according to claim 2, wherein said second mark is located on one of a mask and a substrate.

6. A method according to claim 1, wherein said measuring is accomplished using imaging means to determine the displacement between the first position of the object and the required position of the object.

7. A method according to claim 1, wherein said measuring comprises processing information about the first position of the object, together with information regarding the required position of the object to determine said displacement.

8. A method according to claim 1, wherein said object is held in place using a vacuum generating surface.

9. A method according to claim 1, wherein the translating includes translating the object, the first object table, or both, relatively to each other in two directions.

10. A method of positioning a substrate at a required position on a substrate table, said method comprising:
    placing the substrate at a first position on the substrate table;
    measuring a displacement between the first position of the substrate and a required position of the substrate on the substrate table;
    removing the substrate from the substrate table;

translating the substrate, the substrate table, or both, relative to each other by substantially the displacement, in a direction substantially parallel to the plane of the substrate table; and placing the substrate at substantially the required position on the substrate table, wherein a first surface of the substrate contacts the substrate table, and wherein the required position corresponds to a position of the substrate at which a clamping force that clamps the substrate on the substrate table is substantially homogenous on the first surface of the substrate.

11. A method according to claim 10, wherein said, measuring comprises aligning a first mark on the substrate to a second mark.

12. A method according to claim 10, wherein said measuring is accomplished using an imaging device to determine the displacement between the first position of the substrate and the required position of the substrate.

13. A method according to claim 10, wherein said measuring comprises processing information about the first position of the substrate, together with information regarding the required position of the substrate to determine said displacement.

14. A method according to claim 10, wherein the translating includes translating the substrate, the substrate table, or both, relatively to each other in two directions.

* * * * *